(12) United States Patent
Yueh et al.

(10) Patent No.: US 7,442,487 B2
(45) Date of Patent: Oct. 28, 2008

(54) LOW OUTGASSING AND NON-CROSSLINKING SERIES OF POLYMERS FOR EUV NEGATIVE TONE PHOTORESISTS

(75) Inventors: Wang Yueh, Portland, OR (US); Heidi Cao, Portland, OR (US); Manish Chandhok, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/750,042

(22) Filed: Dec. 30, 2003

(65) Prior Publication Data
US 2005/0147916 A1 Jul. 7, 2005

(51) Int. Cl.
*G03F 7/00* (2006.01)
*G03F 7/004* (2006.01)

(52) U.S. Cl. ............... 430/270.1; 430/312; 430/214
(58) Field of Classification Search ......... 430/270.1, 430/312, 314; 526/242, 247, 281, 320
See application file for complete search history.

(56) References Cited

U.S. PATENT DOCUMENTS

| | | | |
|---|---|---|---|
| 4,767,500 A * | 8/1988 | Patt et al. ............... 162/32 |
| 5,336,815 A * | 8/1994 | Becker et al. ............ 568/857 |
| 6,136,499 A * | 10/2000 | Goodall et al. ........... 430/270.1 |
| 6,359,153 B1 * | 3/2002 | Lee et al. ................ 549/463 |
| 6,369,143 B1 * | 4/2002 | Park et al. ............... 524/157 |
| 6,391,518 B1 * | 5/2002 | Jung et al. ............... 430/270.1 |
| 6,437,052 B1 * | 8/2002 | Iwasa et al. .............. 525/375 |
| 6,548,219 B2 * | 4/2003 | Ito et al. .................. 430/270.1 |
| 6,607,867 B1 * | 8/2003 | Kim et al. ................ 430/270.1 |
| 6,790,587 B1 * | 9/2004 | Feiring et al. ............ 430/270.1 |
| 6,800,418 B2 * | 10/2004 | Yoon et al. .............. 430/270.1 |
| 6,884,564 B2 * | 4/2005 | Feiring et al. ............ 430/270.1 |
| 2002/0016431 A1 * | 2/2002 | Iwasa et al. ............... 526/284 |
| 2002/0042549 A1 * | 4/2002 | Holdstock et al. .......... 585/610 |
| 2002/0058199 A1 * | 5/2002 | Zampini et al. ........... 430/270.1 |
| 2002/0102490 A1 * | 8/2002 | Ito et al. .................. 430/270.1 |
| 2002/0146638 A1 * | 10/2002 | Ito et al. .................. 430/270.1 |
| 2003/0027076 A1 * | 2/2003 | Szmanda ................. 430/270.1 |

(Continued)

FOREIGN PATENT DOCUMENTS

EP 1126322 A2 * 8/2001

(Continued)

OTHER PUBLICATIONS

English language abstract fo JP 11-143067.*

(Continued)

*Primary Examiner*—Amanda C. Walke
(74) *Attorney, Agent, or Firm*—Blakely, Sokoloff, Taylor & Zafman LLP

(57) ABSTRACT

A series structure of a chemically amplified negative tone photoresist that is not based on cross-linking chemistry is herein described. The photoresist may comprise: a first aromatic structure copolymerized with a cycloolefin, wherein the cycloolefin is functionalized with a di-ol. The photoresist may also include a photo acid generator (PAG). When at least a portion of the negative tone photoresist is exposed to light (EUV or UV radiation), the PAG releases an acid, which reacts with the functionalized di-ol to rearrange into a ketone or aldehyde. Then new ketone or aldehyde is less soluble in developer solution, resulting in a negative tone photoresist.

29 Claims, 5 Drawing Sheets

U.S. PATENT DOCUMENTS

| | | | |
|---|---|---|---|
| 2003/0175620 A1* | 9/2003 | Toishi et al. | 430/280.1 |
| 2003/0176583 A1* | 9/2003 | Rhodes et al. | 525/326.2 |
| 2003/0219678 A1* | 11/2003 | Harada et al. | 430/270.1 |
| 2004/0023152 A1* | 2/2004 | Feiring et al. | 430/270.1 |
| 2004/0033436 A1* | 2/2004 | Berger et al. | 430/270.1 |
| 2004/0137360 A1* | 7/2004 | Berger et al. | 430/270.1 |
| 2004/0192867 A1* | 9/2004 | Narita et al. | 526/242 |
| 2004/0229157 A1* | 11/2004 | Rhodes et al. | 430/270.1 |
| 2005/0037289 A1* | 2/2005 | Carr et al. | 430/311 |

FOREIGN PATENT DOCUMENTS

| | | | |
|---|---|---|---|
| JP | 11143067 A | * | 5/1999 |
| WO | WO 2005/066715 A2 | | 7/2005 |

OTHER PUBLICATIONS

Cho Sungseo, et al.,"Negitive Tone 193nm Resists"; Proc SPIE Int Opt Eng; Advances in Resist Technology and Processing XVII; Santa Clara, CA., USA; vol. 3999; 2000; XP002345992; pp. 62-73.

Sooriyakumaran, R., et al.; "Acid-catalyzed Pinacol Rearrangement, Chemically Amplified Reverse Polarity Change"; Proc SPIE Int Soc Opt Eng; Advances in Resist Technology and Processing VIII; San Jose, CA, USA; vol. 1466; 1991; XP002345993; pp. 419-428.

International Search Report and Written Opinion; International Application No. PCT/US2004/043684; Date of mailing: Oct. 14, 2005, pp. 1-11.

International Preliminary Report on Patentability; International Application No. PCT/US2004/043684; Date of mailing: Jul. 13, 2006, pp. 1-7.

* cited by examiner

LOW OUTGASSING AND NON-CROSSLINKING SERIES OF POLYMERS FOR EUV NEGATIVE TONE PHOTORESISTS

FIELD

This invention relates to the field of fabricating semiconductor devices and, in particular, to negative tone photoresists.

BACKGROUND

Modern integrated circuits generally contain several layers of interconnect structures fabricated above a substrate. The substrate may have active devices and/or conductors that are connected by the interconnect structure. As these devices become smaller the need for fine patterning through photolithography has become increasingly more important.

To obtain the fine patterns needed for the current generation of devices, KrF (248 nm) and ArF (193 bm) lasers are being used. The dimension of device will continue to scale down, and may require even shorter wavelengths, such as EUV (13.4 nm). To obtain smaller and finer patterns through the use of shorter wavelength light sources, a new generation of photoresists will be required. The design of the next generation of photoresist may be governed by limitation with EUV tools, such as flare.

When extreme ultraviolet (EUV) steppers are used to expose photoresist to radiation with a wavelength of 13.4 nm, the mid frequency roughness of the optics will cause flare. Flare is produced when the light source is reflected off the reflective optics and passes through the mask to expose the photoresist material, and will reduce the contrast of the aerial image. Small amounts of flare may be able to be corrected for by calculating the amount of flare that will occur and scaling the mask CDs accordingly; however, for higher amounts of flare, alternative strategies are necessary. One strategy is the use of a negative tone resist, especially for poly layers, because the amount of flare is proportional to the amount of light that passes through the mask.

A positive tone photoresist becomes more solulable to a developer solution upon exposure to light, whereas a negative tone photoresist becomes less solulable to a developer solution upon exposure to light. Consequently, when a negative photoresist is used at the poly layer, a dark field mask, instead of a bright field mask, may be used to create a dark field pattern. By using a dark field mask the impact of flare on an underlying layer may be significantly reduced.

Current negative tone photoresists utilize a cross-linking mechanism that makes the exposed portion of the photoresist less solulable to the base developer solution. As cross-linking occurs, the molecular weight of the polymer will decrease. However swelling may occur, since the change in solubility is governed by a change in the molecular weight, and the interactions between the resist and the developer are still very favorable. Swelling of the resist structures will prevent correct pattern transfer and affect the resolution.

Because of these limitations, there is a need for a negative tone photoresist that does not swell during the developing process, thereby, allowing the use of a dark field mask to reduce the effect of flare in patterning.

BRIEF DESCRIPTION OF THE DRAWINGS

The present invention is illustrated by way of example and not intended to be limited by the figures of the accompanying drawings.

DETAILED DESCRIPTION

In the following description, numerous specific details are set forth such as examples of specific developer solutions in order to provide a thorough understanding of the present invention. It will be apparent, however, to one skilled in the art that these specific details need not be employed to practice the present invention. In other instances, well known methods and materials, such as polymerization techniques for fabricating the polymer, spin-coating techniques, chemical amplification strategies, and stripping techniques have not been described in detail in order to avoid unnecessarily obscuring the present invention.

Figure 1:
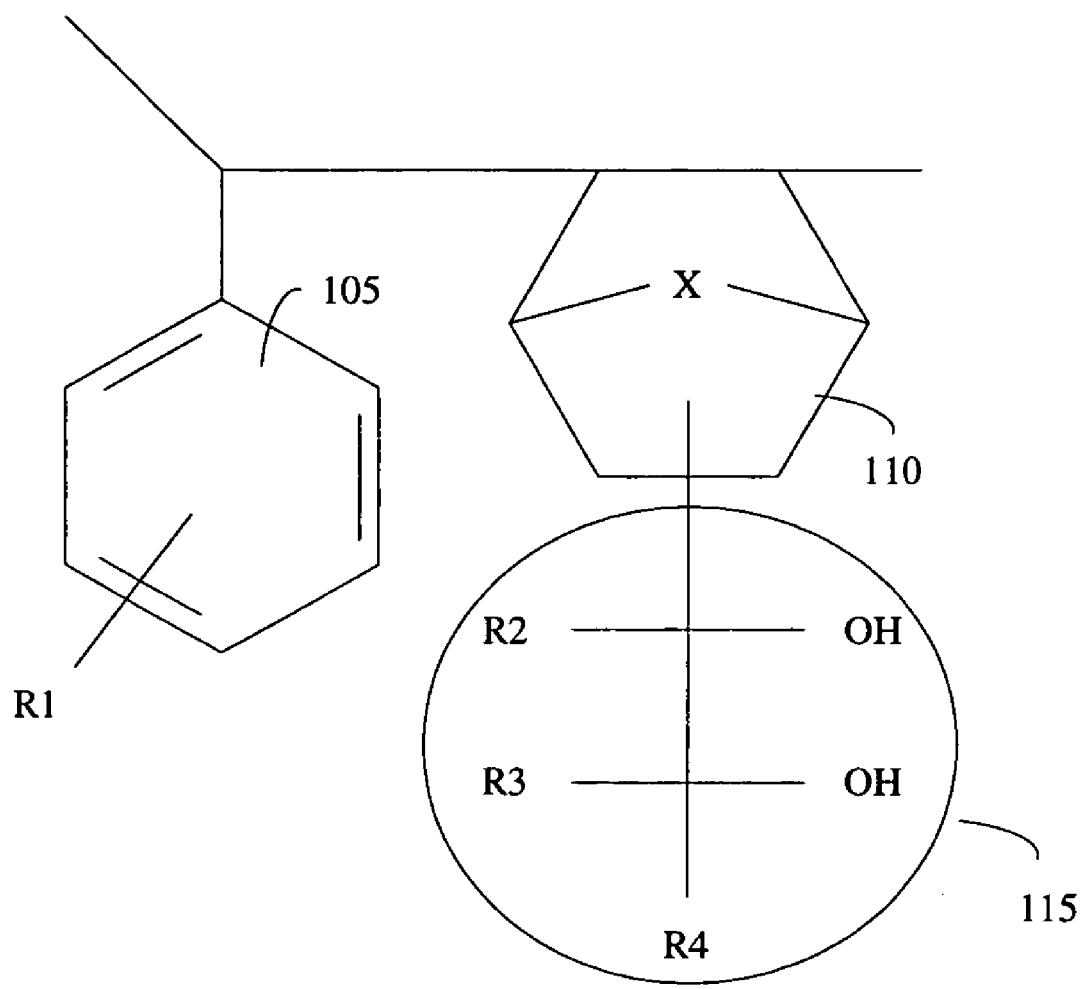
FIG. 1 illustrates a copolymer structure that may be used as a negative tone resist.

FIG. 1 illustrates the chemical structure of copolymer 100 that may be used as the basis of a negative tone photoresist. Copolymer 100 includes first aromatic monomer 105 copolymerized with cycloolefin monomer 110. First aromatic structure 105 may be any aromatic structure, such as benzene and may have a functional group R1 bonded in any position to aromatic structure 105. R1 may be altered to change resist properties, such as the adhesion and/or dissolution characteristics of the photoresist. R1 may be a hydrogen atom, an alkyl group, or a hydroxyl group.

Cycloolefin 110 may be any cycloolefin, such as a second aromatic structure or a norbonene structure. The chemical structure of cycloolefin 110 may be varied by changing the functional group X. As an example, X may be no atom (i.e. an aromatic structure), a carbon atom (norbornene), an alkyl, an oxygen atom, or a sulfur atom.

Cycloolefin 110 may be functionalized with di-ol 115. Di-ol 115 may be an alkyl group with two hydroxyls groups that are bonded to cycloolefin 110.

In addition, di-ol 115 may have additional functional groups, R2, R3, and R4 bonded to it. The selection of functional groups R2, R3, and R4, will affect the resist properties, such as dissolution, adhesion, and etch resistance. For example, R2, R3, and R4 may be individually selected from any of the following: hydrogen, alkyl, aromatic, or cage groups. As another illustrative example, if a cage is used for either one or all of R2, R3, and R4, the etch resistance of the photoresist material may be increased.

It is readily apparent that the photoresist may include other elements and structures. For example the negative tone photoresist may include a photoacid generator (PAG) to facilitate chemical amplification. Chemical amplification is discussed in more detail in reference to FIGS. 5 and 6. As illustrative example, the PAG may be an iodonium, sulfonium, or a non-ionic PAG. The PAG may be used to release the necessary acid, such as an H+ acid, when exposed to light.

Figure 2:
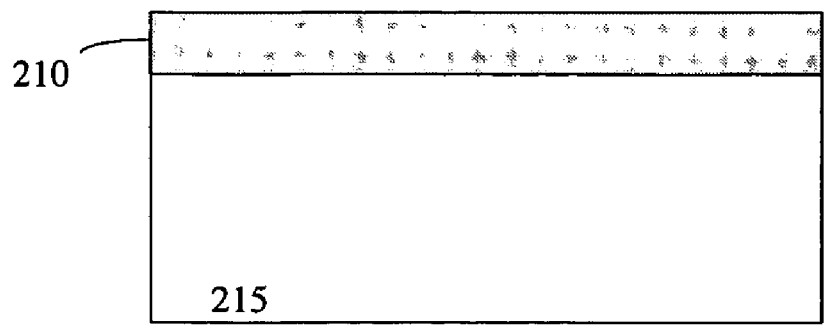
FIG. 2 is a cross-sectional elevation view of a photoresist layer that has been deposited on an underlying layer.

Turning to FIGS. 2-7, an illustrative method of how a photoresist comprising copolymer 100 may be used is depicted. As illustrated in FIG. 2, a photoresist layer 210 is deposited on an underlying layer, such as underlying layer 215, in step 205. Photoresist layer 210 may contain copolymer 100, illustrated in FIG. 1, casting solvents, such as propylene glycol methyl ether acetate (PGMEA), and/or ethyl lactate (EL), and the other necessary components such as PAGs, base quenchers and/or surfactants. Photoresist layer 210 may be deposited by a spin-coating technique onto underlying layer 215. Underlying layer 215 may be any substrate that is used at different layers in the manufacturing of devices, such as silicon, or polysilicon, and it may contain other structures such as gates, local interconnects, metal layers, or other active/passive device structures or layers.

Figure 3:
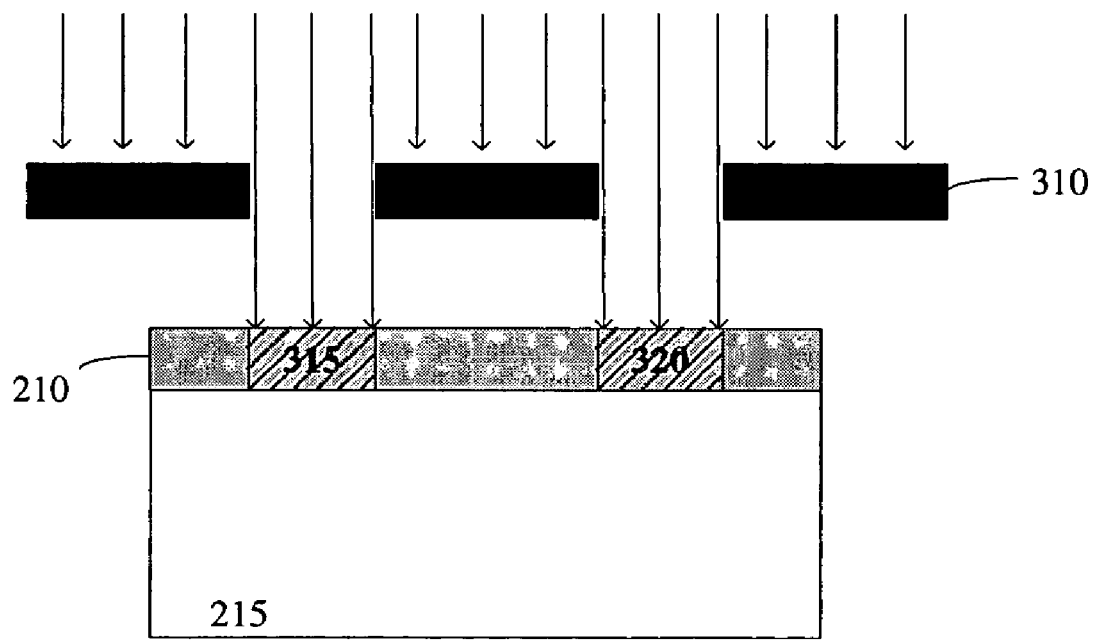
FIG. 3 is a cross-sectional elevation view of FIG. 2 after at least a portion of the photoresist layer has been exposed to radiation through a mask.

In reference to FIG. 3, in step.305, exposed portions 515 and 520 of photoresist layer 210 are exposed to radiation, which may be EUV radiation (13.4 nm), but may also be any other wavelength radiation, such as 248 nm or 193 nm. As described later, step 305 may also include baking and other processes to facilitate chemical amplification. Radiation exposure may occur through mask 310 so that only some sections of the photoresist are exposed, such as exposed portions 315 and 320. Exposed portions 315 and 320 may undergo a pinacol rearrangement, as described in reference to FIG. 6.

As mentioned above, exposure chemistry in step 305 may occur via a chemical amplification strategy. To increase the sensitivity of the photoresist (i.e. reduce the amount of radiation needed to cause the necessary chemical reaction in the exposed portions 315 and 320) the photoresist may be chemically amplified. Chemical amplification occurs when a PAG reacts during exposure to produce an acid catalyst. The acid catalyst then mediates a cascade of reactions as it diffuses through the resist. A post exposure bake (PEB) step may occur after the exposure step to increase the diffusion length of the acid catalyst.

Figure 4:
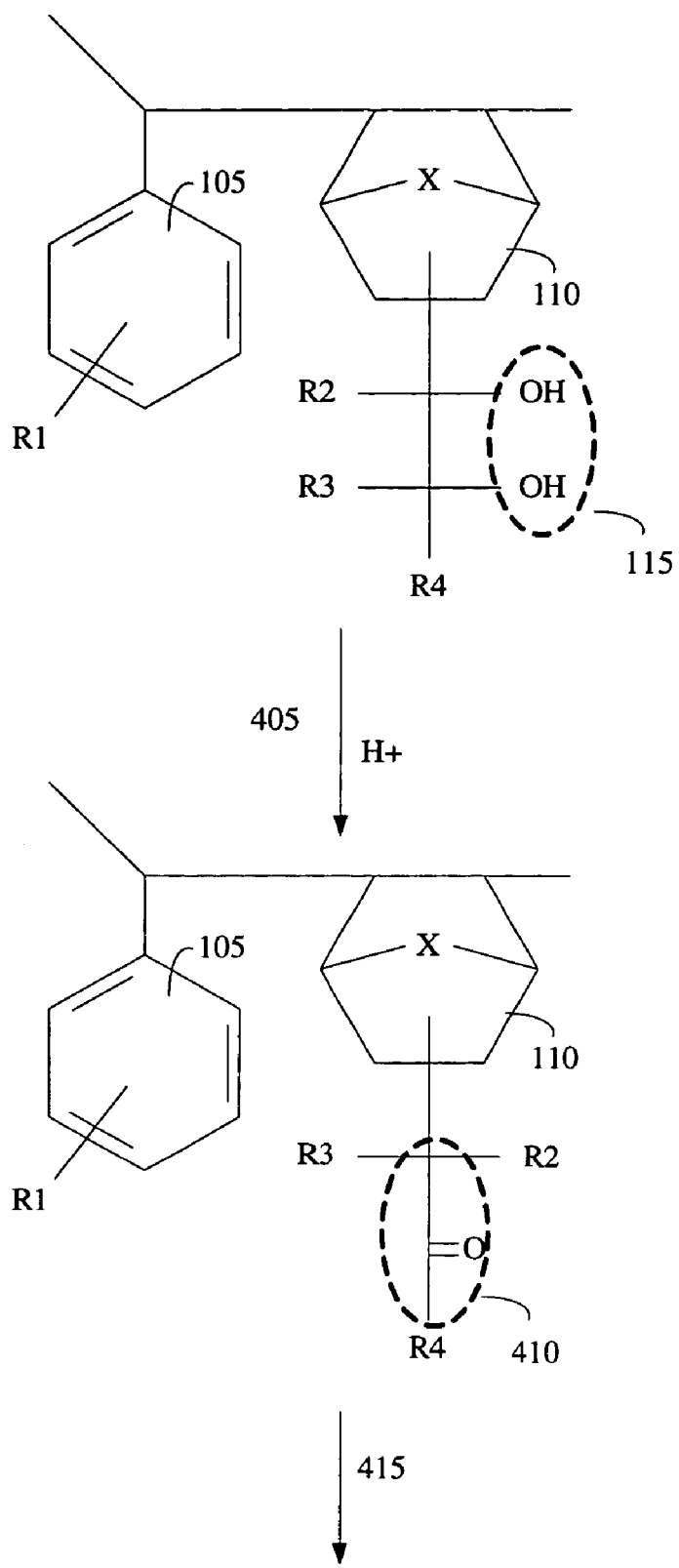
FIG. 4 is the chemical rearrangement that occurs in the exposed portions of the photoresist layer in FIG. 3.

FIG. 4 illustrates the chemistry that will occur in the presence of the acid catalyst to change the solubility of the copolymer. A pinacol rearrangement may occur due to the presence of an acid in exposed portions 315 and 320, shown in FIG. 3. The general pinacol rearrangement chemistry is well known and discussed in, "H. Bosshard, M. E. Baumann and G. Schetty, Helv. Chim. Acta., 53, 1271 (1970)," and "T. E. Zalesskaya and I. K. Lavorva, JOC, USSR, 4, 1999 (1968)." Diol 115 reacts with an H+ acid to form a carbonate containing material, such as a ketone or an aldehyde 410 and a water by-product 415. They H+acid 405 may be regenerated after the pinacol rearrangement, and may continue to diffuse through the resist to mediate further reactions. After rearrangement, functional groups R2, R3, and R4 will be bonded to the resulting ketone or aldehyde 410. The R3 functional group will be bonded to a different carbon after the reaction, consistent with the chemistry of pinacol rearrangement.

Step 305 may also include the generation of water 415. If the pinacol arrangement deprotection occurs while the resist is still under vacuum in the EUV tool, the water may outgas. Outgassing is in general considered very problematic, because it can contaminate the optics. However early research shows that the presence of water or oxygen in the chamber may actually help to clean EUV optics. However high concentrations of water can cause oxidation of the optics, which will damage the optics. The optics may be protected from oxidation by the use of capping layers that are known in the art.

Another method for protecting the optics from oxidation is to design copolymer 100 so that the pinacol rearrangement deprotection has a high activation energy. For reactions with high activation energies, the pinacol rearrangement deprotection will only occur at high temperatures. In this case the acid will be generated under exposure, but the deprotection will not occur until after the wafer has been removed from the exposure toll and is subjected to a PEB. Water that is generated during the PEB may outgas during the PEB, but this should not be problematic since water will not cause damage to the bake tools. The polymer can be designed to have a high deprotection energy for the pinacol rearrangement by selecting the correct functional groups R2, R3, and R4, such as alkyl groups.

Figure 5:
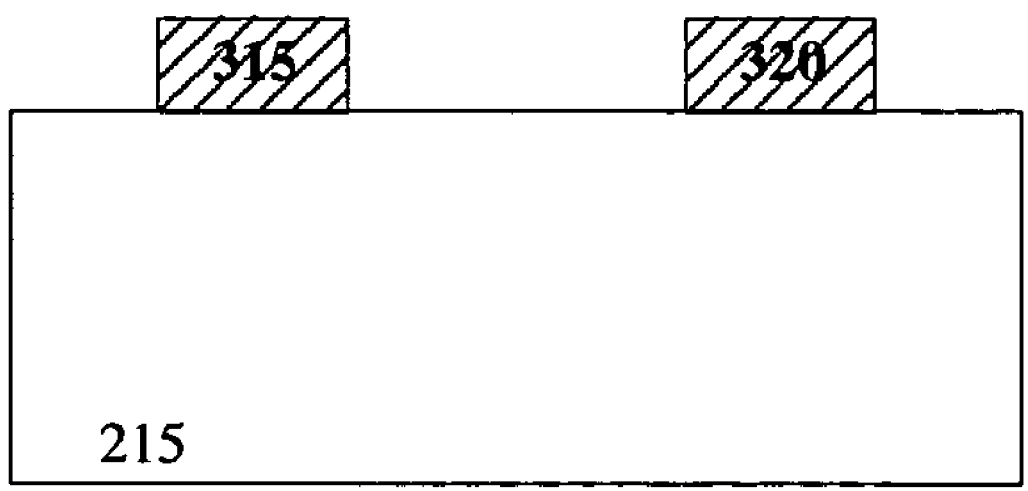
FIG. 5 is a cross-sectional elevation view of FIG. 3 after the photoresist layer has been developed in a developer solution.

As shown in FIG. 5, the newly generated ketone or aldehyde 410, shown in FIG. 4, may be less soluble in an aqueous base developer solution. In step 505, the less soluble exposed portions 315 and 320, when developed in developer solution will remain, while the rest of the photoresist layer 210, depicted in FIG. 3, will be removed by the developer solution. As an illustrative example, 2.38% tetra-methyl ammonium hydroxide (TMAH) may be used as the developer solution. Therefore, a pattern on a mask, such as mask 310 in FIG. 3, may be transferred onto underlying layer 305 with the use of the aforementioned negative tone photoresist.

Figure 6:
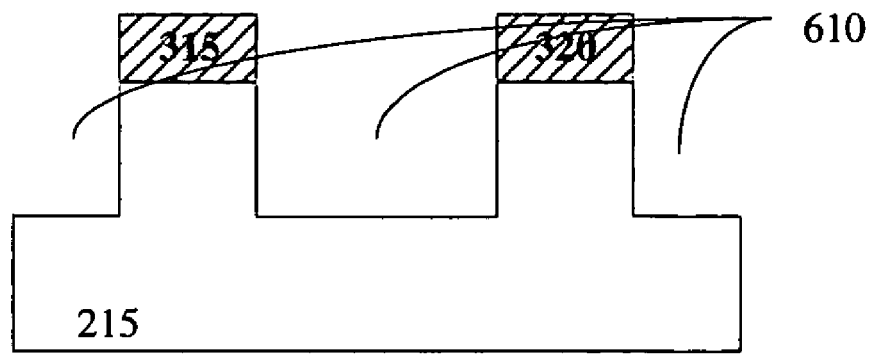
FIG. 6 is a cross-sectional elevation view of FIG. 5 after trenches have been etched in the underlying layer from FIG. 6.
Figure 7:
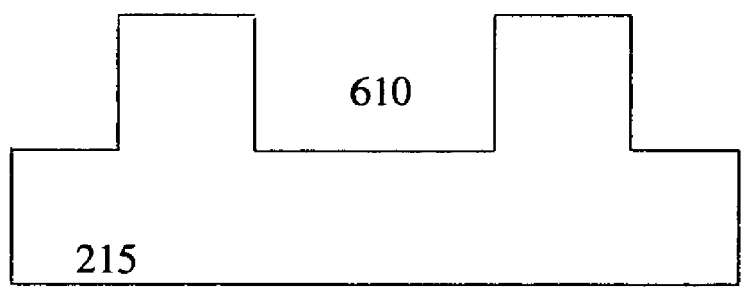
FIG. 7 is a cross-sectional elevation view of FIG. 6 after the remaining photoresist layer has been stripped.

FIGS. 6 and 7 illustrate a single example of how this negative tone photoresist may be used. However, it is readily apparent that many other processing steps may be used to transfer the pattern from the photoresist to the substrate, such as ion implantation instead of/in addition to the steps depicted in FIG. 6 and FIG. 7. Turning to FIG. 6, in step 605, common etchants may be used to etch via openings and/or trenches, such as trenches 610, while exposed portions 315 and 320 remain. Exposed portions 315 and 320 may protect the portions of underlying layer 215 that are beneath exposed portions 315 and 320.

In reference to FIG. 7, exposed portions 315 and 320, shown in FIG. 6, may be stripped away leaving underlying layer 215, with trenches 610. Common photoresist stripping methods may be used to remove exposed portions 315 and 320.

Therefore, as shown above, a negative tone photoresist that is not based on cross-linking chemistry may be made and used. Negative photoresist may have applications at EUV wavelengths to reduce flare. Negative tone resists will reduce flare, because a dark field mask can be used at the poly layer, which reduces flare compared to a bright field mask. The deprotection chemistry may show improved performance over current negative resists based on cross-linking chemistry because swelling may be lower. When portions of the photoresist are exposed to light, the PAGs may generate acids. These acids may react with the di-ol deprotecting group to form ketone/aldehyde and water. The newly generated ketone or aldehyde is less soluble in a developer solution, such as 2.38% TMAH, than the original diol. Consequently, the photoresist that was not exposed will dissolve in the developer solution, while the exposed portions will not dissolve leaving the exposed portions of the photoresist.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A photoresistive material comprising:
a negative tone photoresist having at least a cycloolefin functionalized with a di-ol, wherein the di-ol comprises an alkyl bonded to the cycloolefin, the alkyl functionalized by two hydroxyl groups bonded to adjacent acyclical carbon atoms.

2. The photoresistive material of claim 1, further comprising:
an aromatic structure copolymerized with the cycloolefin.

3. The photoresistive material of claim 2, further comprising a molecule bonded to the aromatic structure, wherein the molecule is selected from a group consisting of a hydrogen atom, an alkyl group, or a hydroxyl group.

4. The photoresistive material of claim 2, further comprising a photo acid generator (PAG).

5. The photoresistive material of claim 1, wherein the di-ol further comprises additional functional groups, each functional group being selected from a group consisting of a hydrogen atom, an alkyl group, an aromatic structure, or a cage.

6. The photoresistive material of claim 1, wherein the cycloolefin is an aromatic structure.

7. The photoresistive material of claim 1, wherein the cycloolefin is a norbornene structure.

8. The photoresistive material of claim 7, wherein the norbornene structure comprises a side-group, wherein the side-group is selected from a group consisting of a carbon atom, and alkyl group, an oxygen atom, or a sulfur atom.

9. A negative tone photoresist comprising:
a copolymerized structure represented by the following molecule

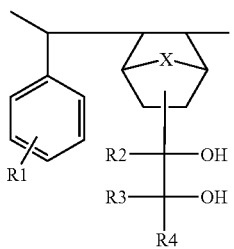

(1)

where R1 is a hydrogen atom, an alkyl, or a hydroxyl, where each of R2, R3 and R4 is a hydrogen atom, alkyl, aromatic, and/or cage, and where X is no atom, a carbon atom, an alkyl, an oxygen atom, or a sulfur atom.

10. A method comprising:
depositing a negative tone photoresist comprising a cycloolefin functionalized with a di-ol on an underlying layer, wherein the di-ol includes an alkyl bonded to the cycloolefin, the alkyl functionalized by two hydroxyl groups bonded to adjacent acyclical carbon atoms; and
exposing at least a portion of the negative tone photoresist to radiation to form at least a carbonate containing material.

11. The method of claim 10, wherein the carbonate containing material is a ketone.

12. The method of claim 10, wherein the carbonate containing material is a aldehyde.

13. The method of claim 10, wherein the underlying layer is a substrate.

14. The method of claim 10, wherein exposing at least a portion of the negative tone photoresist to radiation is done through a mask.

15. The method of claim 10, wherein the radiation is generated from an EUV exposure tool.

16. The method of claim 10, further comprising baking the negative tone photoresist.

17. The method of claim 10, wherein the negative tone photoresist further comprises a first aromatic structure copolymerized with the cycloolefin.

18. The method of claim 17, wherein the first aromatic structure is functionalized with a first functional group.

19. The method of claim 18, wherein the first functional group is selected from a group consisting of a hydrogen atom, an alkyl group, or a hydroxyl group.

20. The method of claim 10, wherein the di-ol further comprises a second, a third, and a fourth functional group, wherein each of the second, third, and fourth functional groups is a hydrogen atom, an alkyl group, an aromatic structure, or a cage.

21. The method of claim 10, wherein depositing the negative tone photoresist on an underlying layer comprises: spin-coating the negative tone photoresist on the underlying layer.

22. The method of claim 10, further comprising developing the negative tone photoresist layer by depositing a developer solution on the negative tone photoresist layer.

23. The method of claim 22, wherein the developer is TMAH.

24. The method of claim 23, wherein the developer is 2.38% TMAH.

25. The method of claim 22, further comprising stripping the at least a portion of the negative tone photoresist layer exposed to UV rays.

26. The method of claim 10, wherein after exposure, the exposed portion of the negative tone photoresist is less solulable to a developer solution.

27. A photoresist comprising:
a cycloolefin functionalized with a di-ol, the di-ol including an alkyl bonded to the cycloolefin, the alkyl functionalized by two hydroxyl groups bonded to adjacent acyclical carbon atoms, wherein the di-ol upon exposure to light, to undergo a pinacol rearrangement, wherein after the pinacol rearrangement the photoresist is less solulable in a developer solution.

28. The method of claim 27, wherein the photoresist further comprises a first aromatic structure copolymerized with the cycloolefin, the first aromatic structure functionalized with a first functional group.

29. The method of claim 28, wherein the first functional group is selected from a group consisting of a hydrogen atom, an alkyl group, or a hydroxyl group.

* * * * *